United States Patent [19]
Yamamura

[11] Patent Number: 5,250,983
[45] Date of Patent: Oct. 5, 1993

[54] PHOTO RETICLE FOR FABRICATING A SEMICONDUCTOR DEVICE

[75] Inventor: Ryuji Yamamura, Tokyo, Japan

[73] Assignee: NEC Corporation, Tokyo, Japan

[21] Appl. No.: 911,475

[22] Filed: Jul. 10, 1992

[30] Foreign Application Priority Data

Jul. 12, 1991 [JP] Japan ................................ 3-198385

[51] Int. Cl.[5] .................... G03B 27/28; G03F 9/00
[52] U.S. Cl. ................................ 355/125; 355/53; 430/5
[58] Field of Search .................... 355/53, 77, 125; 356/400, 401; 430/5

[56] References Cited

U.S. PATENT DOCUMENTS

| | | | |
|---|---|---|---|
| 4,577,958 | 3/1986 | Phillips | 355/53 X |
| 4,597,664 | 7/1986 | Johannsmeier et al. | 355/53 X |
| 4,780,615 | 10/1988 | Suzuki | 356/401 X |
| 4,823,012 | 4/1989 | Kosugi | 356/400 X |
| 4,849,313 | 7/1989 | Chapman et al. | 430/5 |
| 4,937,618 | 6/1990 | Ayata et al. | 355/53 X |
| 4,952,815 | 8/1990 | Nishi | 356/400 X |
| 4,962,423 | 10/1990 | Yamada et al. | 358/101 |
| 4,980,718 | 12/1990 | Salter et al. | 355/53 |
| 5,160,957 | 11/1992 | Ina et al. | 355/53 |

*Primary Examiner*—Richard A. Wintercorn
*Attorney, Agent, or Firm*—Burns, Doane, Swecker & Mathis

[57] ABSTRACT

An original layout pattern for reticle includes a tip pattern region, a scribe region formed around the tip pattern region, and alignment marks formed in the scribe region. Each end of the alignment marks is not reached to a edge of the original layout pattern. Therefore, when the original layout pattern is formed on the reticle side by side in predetermined times, the alignment marks positioned at an inner portion between two adjacent patterns are separated from each other.

3 Claims, 6 Drawing Sheets

50a FIRST PATTERN

50a

62

50 RETICLE

50b SECOND PATTERN

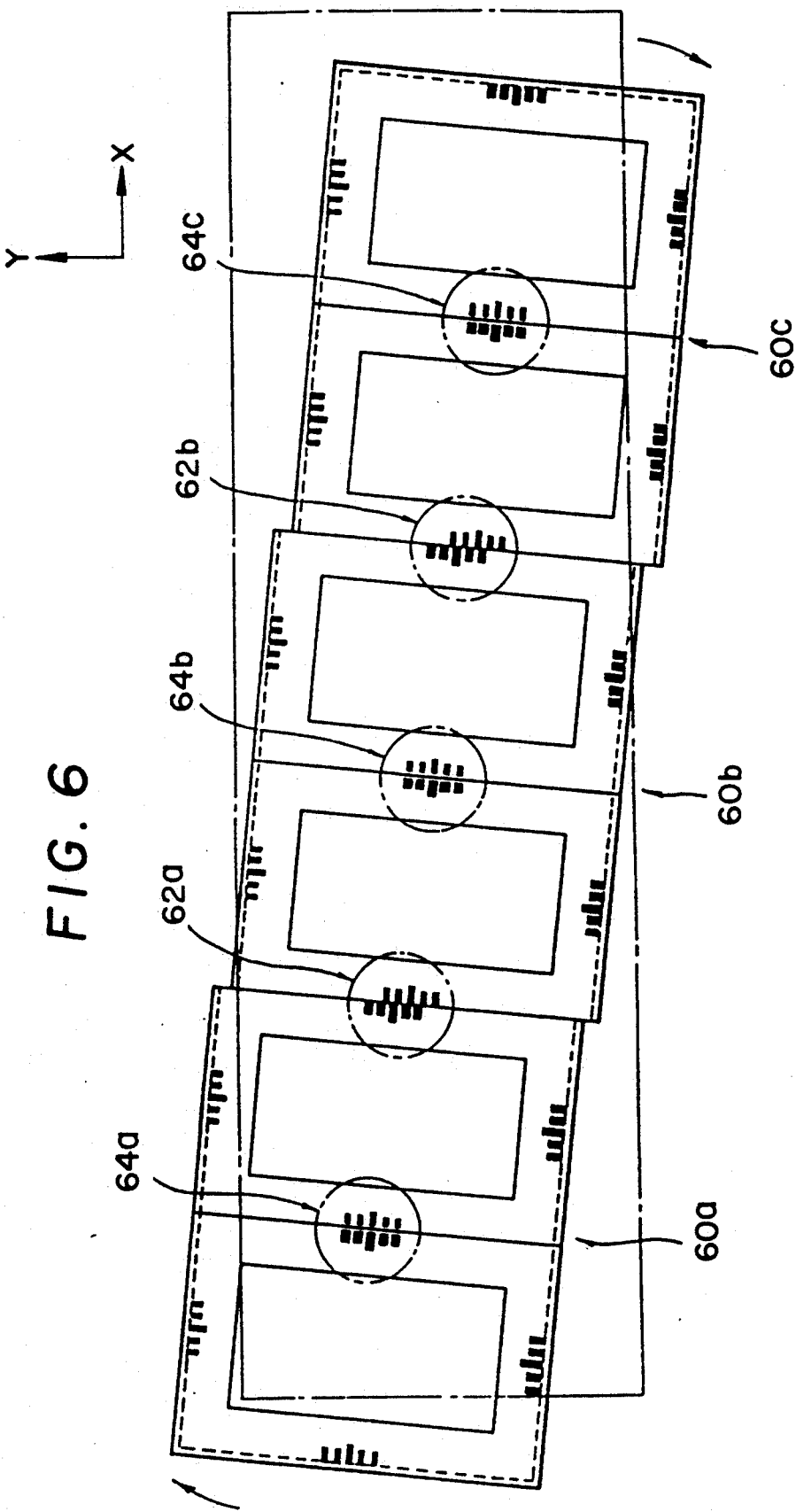

PHOTO RETICLE FOR FABRICATING A SEMICONDUCTOR DEVICE

FIELD OF THE INVENTION

This invention relates to a photo reticle for fabricating a semiconductor device, and more particularly to, a photo reticle including a plurality of tip patterns therein formed with alignment marks differently used for detection of rotation from a standard angle and deviation from a previous step.

BACKGROUND OF THE INVENTION

At present, a projection expose method using a stepper is mainly used for fabricating a semiconductor device. In the projection expose method, a tip pattern formed on a photo reticle is projected on a wafer set on a X-Y stage of the stepper. A photo reticle is fabricated by photolithographic technology using an original layout pattern which has a predetermined tip pattern and alignment marks in a scribe region thereof.

Recently, a reticle which is provided with a plurality of same tip patterns therein has been proposed in order to increase a fabrication efficiency of a semiconductor device. In fabrication of the reticle, a reticle film is exposed to a light passing through an original layout pattern in times corresponding to the number of the tip patterns so that the plural tip patterns are formed on parallel planes defined on the reticle side by side. At the same time, alignment marks are also formed with the tip patterns on the scribe region of the photo reticle.

Next, in projection of a wafer, a wafer base is exposed to a light passing through the reticle at predetermined times, so that the plural reticle patterns are formed on horizontally and vertically defined regions on the wafer side by side. At this time, a rotation of the reticle is monitored on the wafer by using alignment marks positioned along sides of the reticle, and a deviation of a presently used reticle relatively to the position of a former reticle used at a precedent step is monitored by using alignment marks positioned at an inner portion between the tip patterns of the reticle.

According to the conventional photo reticle, however, it is difficult to discriminate the alignment marks between at the inner portion of the reticle and at the sides of the reticle, because the alignment marks are common in configuration between the detection of rotation from a standard angle and deviation from a previous step. The necessity of the alignment mark discrimination is due to the fact that the alignment marks at the inner portion of the reticle are preferably used for the detection of the deviation from the previous step, because these alignment marks are not affected by the rotation from the standard angle, and that the rotation must be detected by use of the alignment marks at the sides of the reticle.

This necessity can be avoided by different alignment marks formed at the sides and the inner portion of the reticle, that is, a specific mark is provided at the inner portion thereof to detect the deviation from the previous step. If this is applied to practical use, however, data for parallel planes on the both sides of the inner portion of the reticle must be prepared, so that the amount of data is increased to manufacture a reticle having a plurality of tip patterns.

SUMMARY OF THE INVENTION

Accordingly, it is an object of the invention to provide a photo reticle for fabricating a semiconductor device by which an alignment of the reticle can be carried out precisely on a wafer without increasing the amount of data step for fabricating the reticle.

According to the invention, a photo reticle for fabricating a semiconductor device, includes:
a plurality of tip pattern regions;
a scribe region surrounding the plurality of tip pattern regions;
a repeat region provided at an outer periphery of the scribe region;
a first alignment mark provided on the scribe region used for detection of rotation from a standard angle, the first alignment mark being terminated on a border line between the scribe and repeat regions; and
a second alignment mark provided on both sides of a symmetrical line defined on the scribe region between the plurality of tip pattern regions, the second alignment mark being composed of first and second mark segments separated by the symmetrical line, the first and second mark segments being common in configuration partially to the first alignment mark.

BRIEF DESCRIPTION OF THE DRAWINGS

The other objects and features of this invention will become understood from the following description with reference to the accompanying drawings; wherein:

FIG. 6 is a plan view showing a wafer pattern formed by using the reticle of the preferred embodiment.

DESCRIPTION OF THE PREFERRED EMBODIMENTS

For better understanding the background of the present invention, the basic principle of the conventional technology is first described hereinafter with reference to FIGS. 1 to 3.

Figure 1:
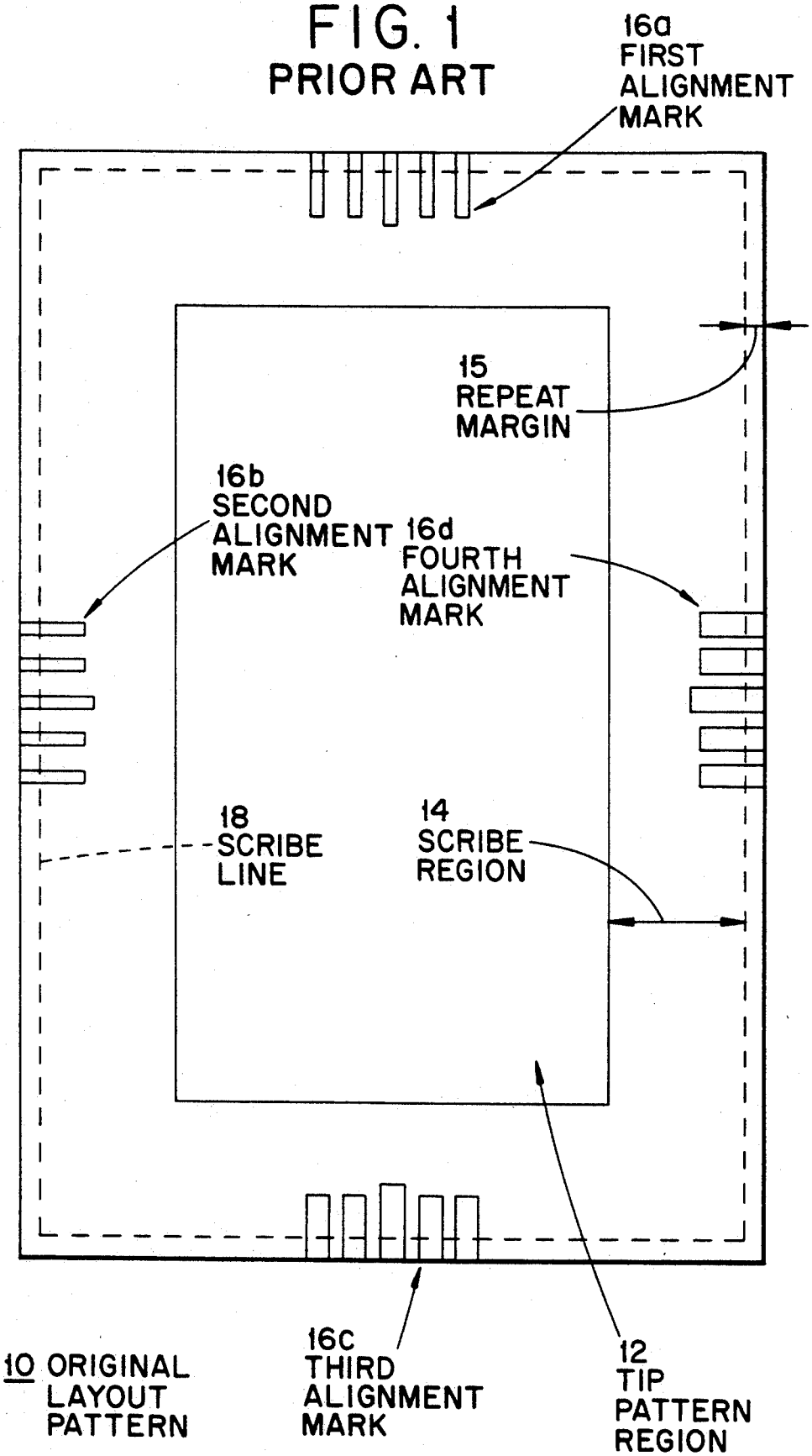
FIG. 1 is a plan view showing a conventional original layout pattern for fabricating a reticle.

FIG. 1 shows a conventional original layout pattern 10 for fabricating a reticle. The conventional original layout pattern 10 includes a tip pattern region 12 formed in the center thereof in which a predetermined circuit pattern is refined, a scribe region 14 formed around the tip pattern region 12, a repeat margin 15 positioned between the scribe margin 14 and the side of the original layout pattern 10, and first, second, third and fourth alignment marks 16a, 16b, 16c and 16d formed at four sides of the original layout pattern 10. In this original layout pattern 10, a dashed line 18 shows a scribe line.

Each end of the alignment marks 16a, 16b, 16c and 16d is reached to the side lines of the original layout pattern 10. The first and second alignment marks 16a and 16b are formed to be the same shape, and the third and fourth alignment marks 16c and 16d are formed to be the same shape.

Figure 2:
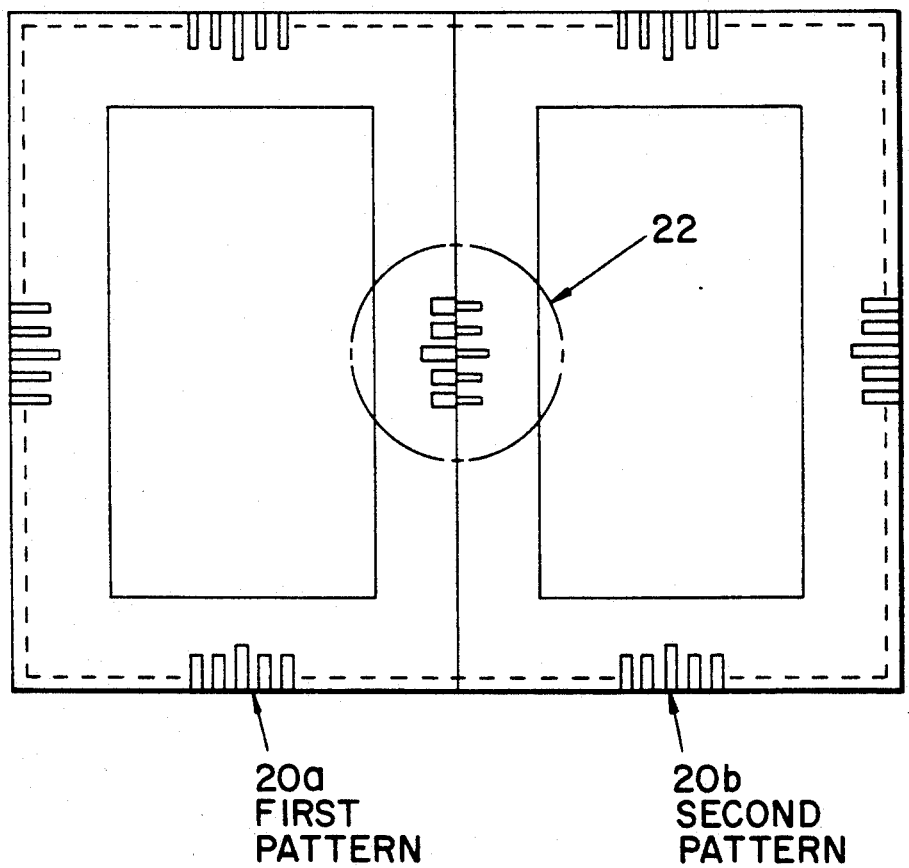
FIG. 2 is a plan view showing a conventional reticle.

FIG. 2 shows a conventional reticle 20 fabricated by using the original layout pattern 10. In this fabrication, at first, the original layout pattern 10 is exposed on a left half portion of a reticle film by electron beams so that a first pattern 20a of the reticle 20 is formed. Next, the original layout pattern 10 is exposed on the adjacent right half portion of the reticle film by electron beams so that a second pattern 20b is formed thereon.

At this time, the scribe lines 18 of the first and second pattern 20a and 20b are overlapped each other.

And, the end portion of the fourth alignment mark 16d of the first pattern 20a and the end portion of the second alignment mark 16b of the second pattern 20b are touched each other at the inner portion of the reticle 20, as shown in a circle 22 of FIG. 2.

Figure 3:
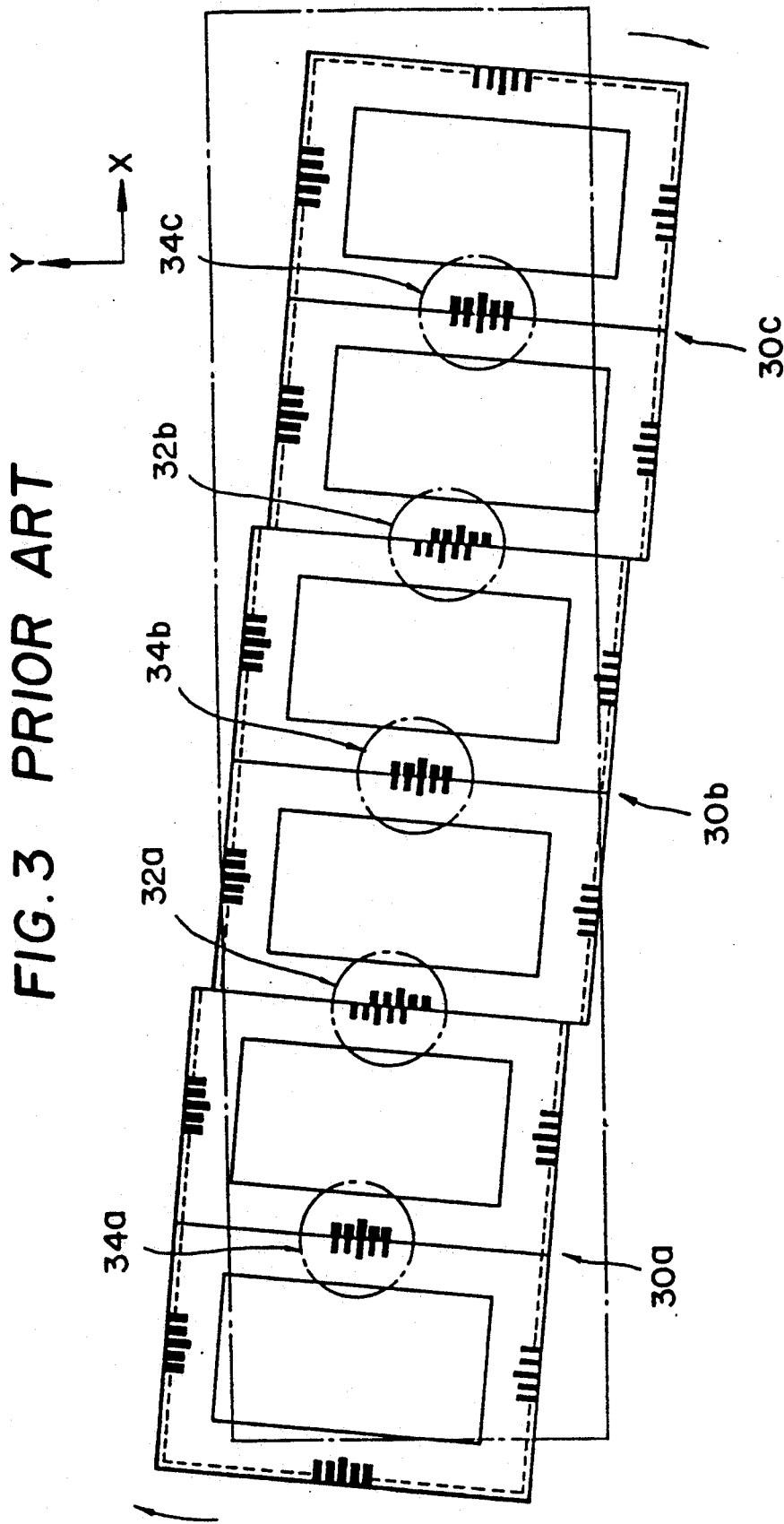
FIG. 3 is a plan view showing a wafer pattern formed by using the conventional reticle.

FIG. 3 shows a wafer pattern fabricated by using the reticle 20. In this fabrication, a first pattern 30a, a second pattern 30b and a third pattern 30c are formed on the wafer side by side. On the wafer, a rotation of the reticle 20 is monitored by using alignment marks positioned at side portions 32a and 32b, and a deviation of the present reticle 20 relatively to the former reticle used at a precedent step is monitored by using alignment marks positioned at inner portions 34a, 34b and 34c of the reticle 20.

On the wafer pattern, it is difficult to discriminate the alignment marks between at each one of the inner portions 34a, 34b and 34c and at each one of the side portions 32a, and 32b, when a rotation angle is small. Therefore, the alignment of the reticle 20 can not be detected precisely on the wafer.

Figure 4:
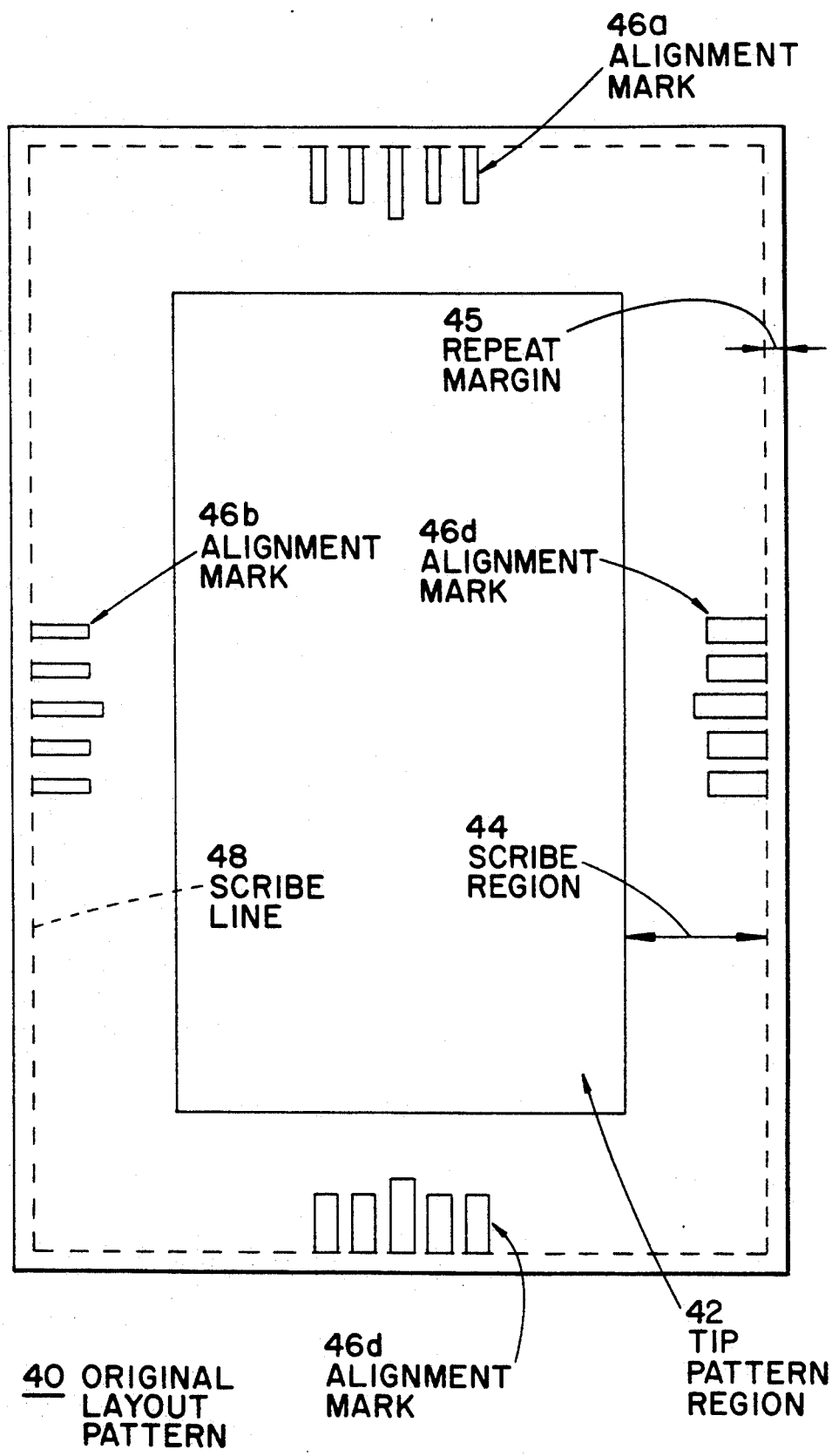
FIG. 4 is a plan view showing an original layout pattern for fabricating a reticle of a preferred embodiment according to the invention.

FIG. 4 shows an original layout pattern 40 of a preferred embodiment according to the invention. The original layout pattern 40 includes a tip pattern region 42 formed in the center thereof in which a predetermined circuit pattern is defined, a scribe region 44 formed around the tip pattern region 42, a repeat margin 45 positioned between the scribe margin 44 and the side line of the original layout pattern 40, and first, second, third and fourth alignment marks 46a, 46b, 46c and 46d formed in the scribe region 44, respectively. In this original layout pattern 10, a dashed line 48 shows a scribe line.

The first and second alignment marks 46a and 46b are formed to be the same shape, and the third and fourth alignment marks 46c and 46d are formed to be the same shape. And, each end of the alignment marks 46a, 46b, 46c and 46d is not reached to the side lines of the original layout pattern 40, that is, each end of the alignment marks 46a, 46b, 46c and 46d is terminated to reach the scribe line 48.

Figure 5A:
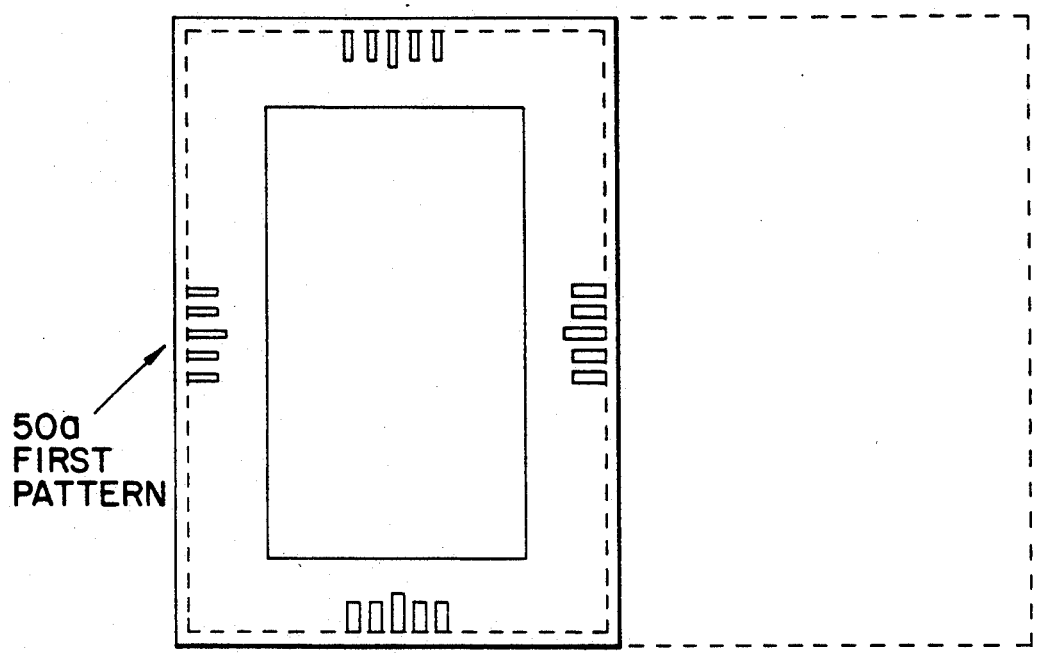
FIG. 5A is a plan view showing a first step of fabricating a reticle of the preferred embodiment.

As shown in FIG. 5A, in fabrication of a reticle 50 by using the original layout pattern 40, at first, a reticle film is exposed to electron beams passing through the original layout pattern 40 so that a first pattern 50a of the reticle 50 is formed.

At this time, a region corresponding to the scribe region 44 and the repeat margin 45 becomes black in accordance with the electron beam exposure.

Figure 5B:
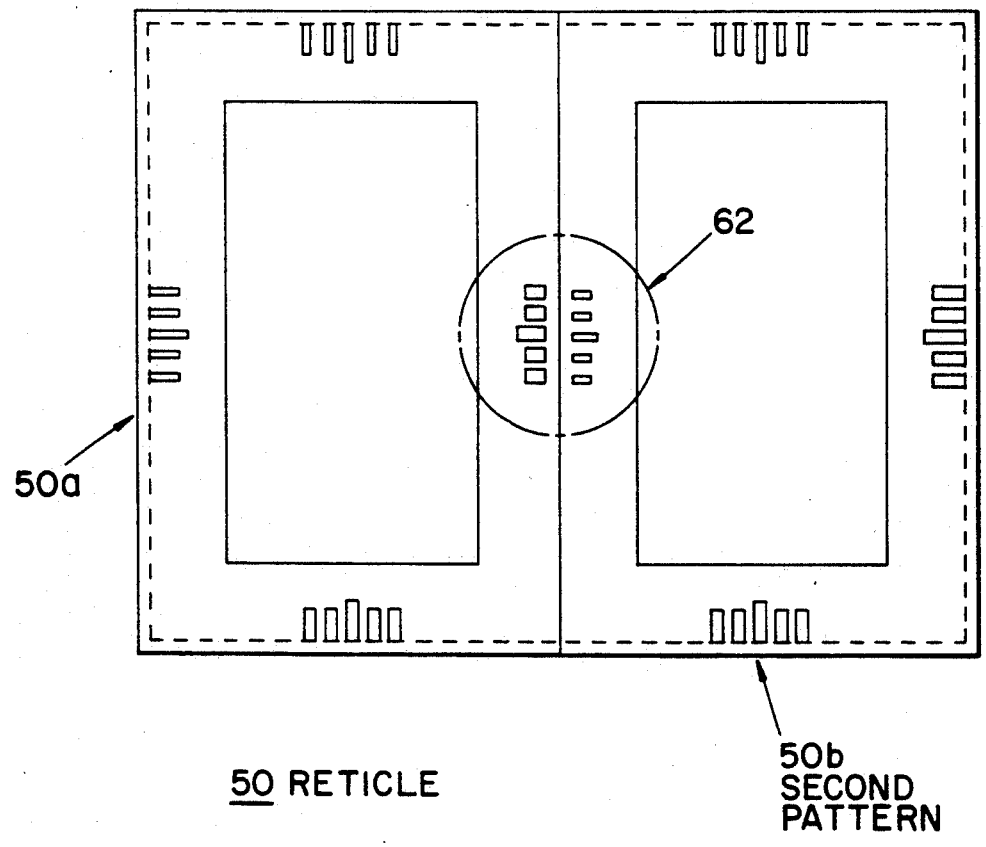
FIG. 5B is a plan view showing a reticle of the preferred embodiment.

Next, as shown in FIG. 5B, the adjacent portion of the first pattern 50a is exposed to electron beams passing through the original layout pattern 40 so that a second pattern 50b is formed thereon. At this time, the scribe lines 18 of the first and second patterns 50a and 50b overlap each other, so that the right side terminated portions of the alignment mark 46d of the first pattern 50a become black by a width of the repeat margin 45. On the other hand, the left side terminated portions of the alignment mark 46d of the second pattern 50b are positioned on the blacked repeat margin 45 of the first pattern 50a. As a result, the alignment mark 46d of the first pattern 50a and the alignment mark 46b of the second pattern 50b are formed to be separated at an inner portion 62.

FIG. 6 shows a wafer pattern fabricated by using the reticle 50. In this fabrication, a first pattern 60a, a second pattern 60b and a third pattern 60c are formed on the wafer side by side. On the wafer, a rotation of the reticle 50 is monitored by using alignment marks positioned at sides 62a and 62b, and a deviation of the present reticle 50 relatively to the former reticle used at a precedent step is monitored by using alignment marks positioned at inner portions 64a, 64b and 64c of the each pattern.

As described above, according to the preferred embodiment, the alignment marks can be discriminated easily between at each of the inner portions 64a, 64b and 64c and at each one of the side portions 62a and 62b. Therefore, the alignment of the reticle 50 can be carried out precisely on the wafer.

Although the invention has been described with respect to specific embodiment for complete and clear disclosure, the appended claims are not to be thus limited but are to be construed as embodying all modification and alternative constructions that may occur to one skilled in the art which fairly fall within the basic teaching herein set forth.

What is claimed is:

1. A reticle for fabricating a semiconductor device, comprising:
    a plurality of tip pattern regions;
    a scribe region surrounding said plurality of tip pattern regions;
    a repeat region provided at an outer periphery of said scribe region;
    a first alignment mark provided on said scribe region used for detection of rotation from a standard angle, said first alignment mark being terminated on a border line between said scribe and repeat regions; and
    a second alignment mark provided on both sides of a symmetrical line defined on said scribe region between said plurality of tip pattern regions, said second alignment mark being composed of first and second mark segments separated by said symmetrical line, said first and second mark segments being common in configuration partially to said first alignment mark.

2. A reticle for fabricating a semiconductor device, according to claim 1, wherein:
    said first alignment mark is composed of first parallel stripes and second parallel stripes each narrower than said first parallel stripes, said first parallel stripes being arranged at bottom and right sides of on said scribe region, and said second parallel stripes being arranged at top and left sides of said scribe region; and
    said first mark segments of said second alignment mark are of a partial length of said first parallel stripes and arranged on a left side of said symmetrical line, and said second mark segments of said second alignment mark are of a partial length of said second parallel stripes and arranged on a right side of said symmetrical line.

3. A reticle for fabricating a semiconductor device, according to claim 2, wherein:

each one of said plurality of tip pattern regions is provided sequentially, a provision of a first one of said plurality of tip pattern regions providing said first parallel stripes to be used for said first alignment mark and said second parallel stripes to be partially used for said second alignment mark in cooperation with said first parallel stripes defined by a subsequent provision of a second one of said plurality of tip pattern regions.

* * * * *